United States Patent [19]
Dutt

[11] Patent Number: 4,477,824
[45] Date of Patent: Oct. 16, 1984

[54] LIGHT EMITTING DEVICE FOR OPTICAL SWITCHING

[75] Inventor: Bulusu V. Dutt, Parsippany, N.J.

[73] Assignee: AT&T Bell Laboratories, Murray Hill, N.J.

[21] Appl. No.: 354,773

[22] Filed: Mar. 4, 1982

[51] Int. Cl.³ .............................................. H01L 33/00
[52] U.S. Cl. ........................................ 357/17; 357/16; 357/61; 357/88
[58] Field of Search ........................ 357/17, 16, 61, 88

[56] References Cited

U.S. PATENT DOCUMENTS

| | | | |
|---|---|---|---|
| 3,634,872 | 1/1972 | Umeda ................................ | 317/234 |
| 3,852,591 | 12/1974 | Lee et al. ............................. | 357/88 |
| 3,958,265 | 5/1976 | Charmakadze et al. ............. | 357/17 |
| 4,122,486 | 10/1978 | Ono et al. ............................ | 357/17 |
| 4,275,404 | 6/1981 | Cassiday ............................. | 357/19 |
| 4,296,425 | 10/1981 | Nishizawa ........................... | 357/17 |

FOREIGN PATENT DOCUMENTS 2603316  8/1976  Fed. Rep. of Germany ........ 357/17

OTHER PUBLICATIONS

Journal of Applied Physics, vol. 48, No. 6, Jun. 1977, pp. 2485–2492.
The Bell System Technical Journal, vol. 59, No. 2, Feb. 1980, pp. 161–168.

*Primary Examiner*—Martin H. Edlow
*Assistant Examiner*—William A. Mintel
*Attorney, Agent, or Firm*—Lester H. Birnbaum

[57] ABSTRACT

A single heterostructure light emitting device which provides high speed and high efficiency. The device includes adjacent n- and p- regions of a mixed-crystal III-V semiconductor such as GaAlAs. A lightly-doped wide bandgap injection layer is utilized to force recombination in the more heavily-doped adjacent region. The latter region also includes a graded bandgap which allows photon recycling for high efficiency.

7 Claims, 3 Drawing Figures

LIGHT EMITTING DEVICE FOR OPTICAL SWITCHING

BACKGROUND OF THE INVENTION

This application relates to light emitting devices, and in particular to high speed light emitting devices useful for optical switching.

In many areas of electronics, high speed optical switching is necessary. For example, opto-isolators which employ a combination of light emmitting device (LED) and optically coupled light detector are used extensively for electrical isolation in telephone equipment and are gaining increasing importance for use with microprocessors. In many of such applications, high switching speeds are necessary to permit interfacing with high speed logic circuits. High quantum efficiency is also desirable for maximum performance. However, in most cases one of these goals is attained only at the cost of the other. For example, it is desirable to provide a graded bandgap region for light emission in $Ga_{1-x}Al_xAs$ heterojunction devices so that photons are absorbed and re-emitted to increase external quantum efficiency. (See Dawson, "High Efficiency Graded-Band-Gap $Ga_{1-x}Al_xAs$ Light Emitting Diodes", Journal of Applied Physics, Vol. 48, pp. 2485-2492 (June 1977), and U.S. Pat. No. 4,275,404 issued to Cassiday, et al.) This recycling of emitted photons, however, has a tendency to reduce the speed of the device. In addition, use of silicon as an impurity dopant in such structures can further decrease speed. Other proposals have taught various bandgap configurations for reducing absorption losses and/or enhancing injection efficiency. For example, U.S. Pat. No. 4,122,486 issued to Ono, shows a III-V heterostructure device where the n-layer has a significantly greater bandgap than an adjacent p-layer to improve injection efficiency. The p-layer is formed on a p+ substrate. U.S. Pat. No. 4,296,425 issued to Nishizawa also shows in one embodiment a device including, successively, a p+ substrate, a p-layer, and an n-layer, where the p-layer has a graded bandgap and the n-layer has a significantly greater bandgap than the p-layer to minimize absorption in the n-layer and p-layer. Such proposals do not teach how the speed of the device may be enhanced.

On the other hand, Dawson, et al, "Reliable, High Speed LEDs for Short-Haul Optical Data Links", Bell System Technical Journal, Vol. 59, pp. 161-168 (February 1980) shows use of a $Ga_{1-x}Al_xAs$ n-layer with a significantly greater bandgap than an adjacent GaAs p-layer combined with a higher impurity concentration in the p-layer to obtain high switching speeds. However, the efficiency of such a device is lowered significantly when operating at the low currents (approximately 10 milliamps) used for opto-isolators. Further, devices used in opto-isolators cannot take advantage of a d.c. pre-bias, as used in data link applications, which contributes to an increased switching speed.

It is therefore a primary object of the invention to provide a heterojunction light emitting device which combines high speed and high efficiency at low current levels.

SUMMARY OF THE INVENTION

This and other objects are achieved in accordance with the invention. The light emitting device comprises a first region of a first conductivity type comprising a mixed crystal III-V semiconductor with a graded bandgap, and adjacent thereto a second region of opposite conductivity type comprising a mixed crystal III-V semiconductor thereby forming a heterojunction between the two regions. The bandgap of the first region continuously decreases in a direction away from the junction. The second region has a significantly wider bandgap in the vicinity of the junction and a lower impurity concentration than the first region.

BRIEF DESCRIPTION OF THE DRAWING

These and other features of the invention are delineated in detail in the following description. In the drawing.

It should be appreciated that for purposes of illustration, these figures are not necessarily drawn to scale.

DETAILED DESCRIPTION OF THE INVENTION

Figure 1:
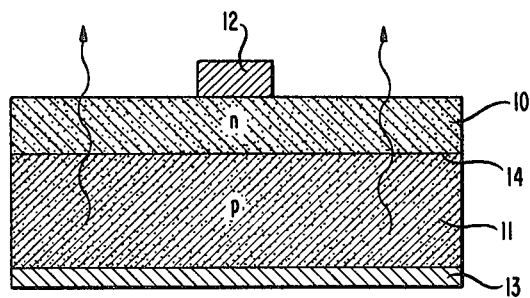
FIG. 1 is a cross-sectional view of a light emitting device in accordance with one embodiment of the invention.
Figure 2:
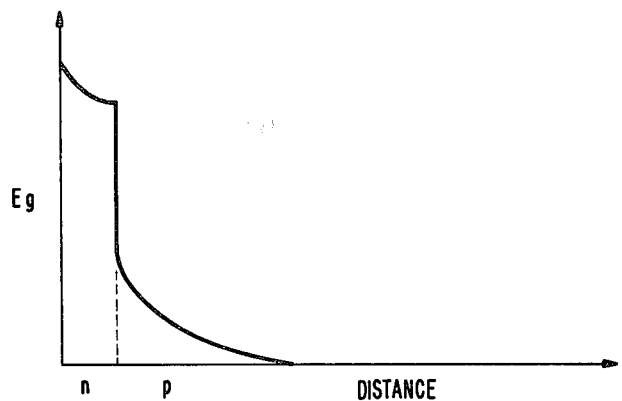
FIG. 2 is a sketch illustrating the bandgap of the semiconductor material as a function of the distance from the top of the device in accordance with the same embodiment.

The invention will be described with reference to the device shown in FIG. 1 and the variation in bandgap shown in FIG. 2. A particular example will be described without any intention of limiting the invention thereby.

The device in this example consisted essentially of a layer 10, of n-type $Ga_{1-x}Al_xAs$, a layer, 11, of p-type $Ga_{1-y}Al_yAs$ adjacent thereto to form a heterojunction 14, and ohmic contacts, 12 and 13, to the n-type and p-type layers, respectively. The contact, 13, comprised a beryllium-gold alloy and contact, 12, was an Al-Au-Sn-Au multi-layer in accordance with standard practice.

The regions 10 and 11 were fabricated by liquid phase epitaxial techniques, described in more detail below, with a variation in the aluminum concentration to produce the bandgap profile illustrated in FIG. 2. In this example, the aluminum concentration x of the n-layer started at a value of approximately 0.35 at the surface and decreased to 0.30 at the junction. This corresponded to a bandgap, $E_g$, of 1.86 eV and 1.80 eV, respectively. In the p-layer, 11, the concentration, v, was 0.10 at the junction ($E_g=1.55$ eV) and decreased to zero at a distance of approximately 80 $\mu$m from the junction. The n-layer was lightly doped with tellurium at a concentration of approximately $5 \times 10^{16}$ cm$^{-3}$ at the junction, while the p-layer was heavily doped with germanium at a concentration of approximately $1 \times 10^{19}$ cm$^{-3}$ at the junction. The n-type layer was approximately 20 $\mu$m thick, while the p-type layer was approximately 100 $\mu$m thick. The chip measured $12 \times 12$ mils.

It will be noted that a graded bandgap is employed in the p-layer. This will cause recycling of photons directed toward the bottom of the device (which would otherwise be lost) provided that the bandgap is always decreasing in a direction away from the junction. The absorption and re-emission of photons in the p-layer as a result of the graded bandgap is primarily responsible for the enhanced quantum efficiency of the device. However, the speed of the device suffers primarily due to increased fall times.

The speed of the device is increased by a combination of the significantly higher bandgap and lower impurity concentration in the n-type layer along with the high impurity concentration in the adjacent p-type layer. The net effect is to reduce the space charge capacitance of the junction and force recombination of carriers to occur in the p-layer where there is a higher doping concentration and therefore recombination can occur at a faster rate. This reduces the onset delay and rise times of the device.

Figure 3:
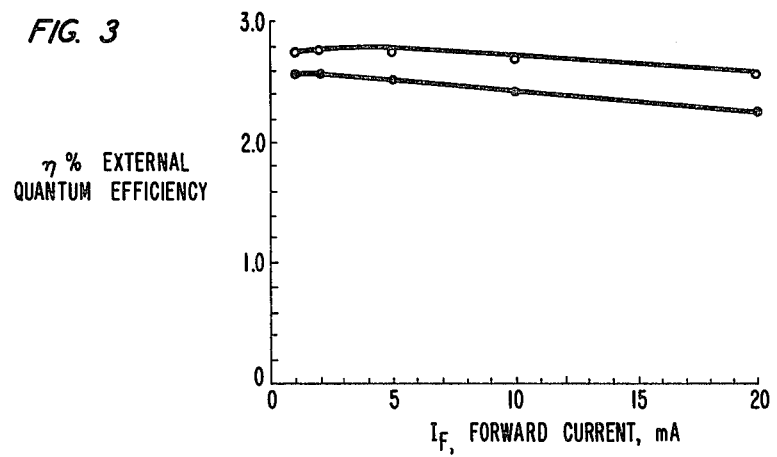
FIG. 3 is a graph of the external quantum efficiency as a function of forward current for two groups of devices fabricated in accordance with the same embodiment.

Unencapsulated devices fabricated from two different wafers and having the parameters given above exhibited the quantum efficiencies shown in the two curves of FIG. 3. Each curve is an average value for ten devices from each wafer. The top curve shows devices emitting light at 815 nm, while the bottom curve shows 818 nm devices. It will be noted that the efficiencies were within the range 2.5-3.0 percent for forward currents of 10 milliamps or less. It is desirable for the quantum efficiency of a device used in many opto-isolators to be at least 2.0 percent. At the same time, average rise and fall times of ten to ninety percent of output were 28-35 nanoseconds. Rise and fall times of 40 nanoseconds or less are desirable in many switching applications. Speeds were measured at 10 milliamps with no pre-bias.

In order to achieve high speed and efficiency in accordance with the invvention it is recommended that the aluminum concentration (x) of the n-layer fall within the range 0.25-0.35 at the junction and be at least 0.15 greater than that of the adjacent p-layer. In order to minimize space charge capacitance, it is recommended that the n-layer impurity concentration fall within the range $1 \times 10^{16} - 1 \times 10^{17}$ cm$^{-3}$ at the junction. The impurity concentration of the p-layer is preferably in the range $5 \times 10^{18} - 1 \times 10^{19}$ cm$^{-3}$ at the junction to insure high speeds. The aluminum concentration (y) of the p-layer in this particular example should be within the range 0.08-0.12 at the junction.

One of the surprising features of the invention, as shown in FIG. 3, is the fact that the external quantum efficiency decreases rather than increases as the current increases. This effect is believed to be beneficial when the device is used in many applications. For example, a "diffusion tail" in response characteristics often results from electron-hole pairs formed in the detector outside the depletion region in response to impinging light. When the detector is coupled to a threshold sensing circuit, turn-off or turn-on of the circuit can be prevented if the amplitude of the tail is sufficiently high. Since this amplitude will be proportional to the light from the LED, a lowering of the efficiency as current increases will insure that switching of the circuit coupled to the opto-isolator will not be impaired over a wide dynamic current range.

Devices in accordance with the above-described example were fabricated by liquid phase epitaxy starting with a substrate comprising n-type GaAs approximately 300 μm thick. The n-type layer, 10, was grown from a melt containing gallium, aluminum and arsenic with tellurium as a dopant in a temperature range of 920-900 degrees Celsius producing the slightly graded bandgap profile of FIG. 2. The p-layer, 11, was formed from a second melt containing gallium, aluminum and arsenic with germanium as a dopant in a temperature range of 900-800 degrees Celsius so that the graded bandgap of FIG. 2 was produced. (For more details of a standard two-phase liquid epitaxial process, see Dawson, et al, "Reliable, High-Speed LEDs for Short-Haul Optical Data Links", Bell System Technical Journal, Vol. 59, page 161 (1980).)

For best results, the substrate should be removed. Otherwise efficiency may suffer, apparently due to absorption of light in the substrate. In this particular example, the substrate was removed by applying an etchant comprising a 30 percent solution of $H_2O_2$ with a pH of 8.5.

While the invention has been described with reference to a GaAlAs heterojunction device, the principles described herein may also be applicable to heterojunction devices comprising other mixed crystal III-V semiconductor materials. The dopants can be any of the standard n-type or p-type impurities, and the impurity concentrations may fall within the ranges previously described.

Various additional modifications will become apparent to those skilled in the art. All such variations which basically rely on the teachings through which the invention has advanced the art are properly considered within the spirit and scope of the invention.

What is claimed is:

1. A semiconductor light emitting device comprising:
   a first region comprising a mixed crystal III-V semiconductor having a first conductivity type and a graded bandgap; and
   a second region comprising a mixed crystal III-V semiconductor having an opposite conductivity type adjacent to said first region thereby forming a heterojunction between the two regions with the bandgap of the first region continuously decreasing in a direction away from the junction and the second region having a significantly wider bandgap and a lower dopant impurity concentration at the junction than the first region.

2. The device according to claim 1 wherein the mixed-crystal III-V semiconductor comprises GaAlAs.

3. The device according to claim 2 wherein the aluminum concentration of the first region lies within the range 0.08-0.12 at the junction, and the aluminum concentration of the second region lies within the range 0.25-0.35 at the junction and is at least 0.15 greater than that of the first region.

4. The device according to claim 3 wherein the dopant impurity concentration of the first region is within the range $5 \times 10^{18} - 1 \times 10^{19}$ cm$^{-3}$ at the junction, and the dopant impurity concentration of the second region is within the range $1 \times 10^{16} - 1 \times 10^{17}$ cm$^{-3}$ at the junction.

5. The device according to claim 1 wherein the external quantum efficiency is at least 2 percent and the rise and fall times are each less than 40 nanoseconds at 10 milliamps of forward current applied to the device.

6. The device according to claim 1 wherein the external quantum efficiency decreases as the forward current applied to the device increases from zero to at least 10 milliamps.

7. In an opto-isolator, a light emitting device having an external quantum efficiency of at least 2.0 percent and rise and fall times each of less than 40 nanoseconds at 10 milliamps of forward current applied to the device with no pre-bias, the device consisting essentially of:
   a first layer comprising $Ga_{1-y}Al_yAs$ of p-conductivity type having a graded bandgap and having a dopant impurity concentration within the range $5\times 10^{18}$–$1\times 10^{19}$ cm$^{-3}$ at the junction formed with a second layer;

a second layer comprising Ga$_{1-x}$Al$_x$As of n-conductivity type adjacent to said first layer thereby forming a single heterojunction between the two layers with a dopant impurity concentration in the second layer at the junction in the range $1\times 10^{16}$–$1\times 10^{17}$ cm$^{-3}$ and the bandgap of the first layer continuously decreasing in a direction away from the junction, where $0.08 \leqq y \leqq 0.12$ and $0.25 \leqq x \leqq 0.35$ at said junction; and ohmic contacts formed at the surfaces of the two layers opposite from the heterojunction.

* * * * *